United States Patent [19]
Koradia et al.

[11] Patent Number: 6,053,808
[45] Date of Patent: Apr. 25, 2000

[54] EXHAUST VENT FOR AN ELECTRONIC CHASSIS

[75] Inventors: Amir Koradia, Palatine; Philip A. Ravlin, Bartlett; Hong Li, Carol Stream, all of Ill.

[73] Assignee: 3Com Corporation, Rolling Meadows, Ill.

[21] Appl. No.: 09/360,565

[22] Filed: Jul. 26, 1999

[51] Int. Cl.[7] ................................... H05K 5/00
[52] U.S. Cl. ......................... 454/184; 361/692; 361/694
[58] Field of Search .............................. 312/223.2, 236; 165/80.3, 121–126; 364/708.1; 211/47, 50, 69.1, 41.17; 361/687–690, 681, 692–695, 784, 785, 788, 796, 801, 391; 454/184, 87; 62/391; 134/114; 34/235

[56] References Cited

U.S. PATENT DOCUMENTS

| | | | |
|---|---|---|---|
| 2,825,500 | 3/1958 | McLean | 454/184 |
| 3,771,293 | 11/1973 | Vest | 55/319 |
| 3,971,877 | 7/1976 | Lee | 174/16 R |
| 4,179,821 | 12/1979 | Herbst et al. | 34/235 |
| 4,184,500 | 1/1980 | Herbst | 134/114 |
| 5,142,445 | 8/1992 | Sorenson et al. | 361/391 |
| 5,251,096 | 10/1993 | Hosoi et al. | 361/695 |
| 5,297,004 | 3/1994 | Mazura | 361/690 |
| 5,372,543 | 12/1994 | Steele | 454/184 |
| 5,462,569 | 10/1995 | Benjamin | 55/385.6 |
| 5,542,757 | 8/1996 | Chang | 312/223.2 |
| 5,544,012 | 8/1996 | Koike | 361/695 |
| 5,697,840 | 12/1997 | Bainbridge et al. | 454/184 |
| 5,851,143 | 12/1998 | Hamid | 454/57 |
| 5,950,446 | 9/1999 | Tromblee et al. | 62/262 |
| 5,969,942 | 10/1999 | Heckner et al. | 361/695 |

FOREIGN PATENT DOCUMENTS 2235564  1/1974  Germany ................. 454/184

*Primary Examiner*—Denise L. Ferensic
*Assistant Examiner*—Andrea M. Joyce
*Attorney, Agent, or Firm*—Baniak Nicholas Pine & Gannon

[57] ABSTRACT

An exhaust vent for venting exhaust air from an electronic chassis includes a body portion having a length. The body portion is mounted to the electronic chassis. The body portion includes an upper portion that extends along the length of the body portion and a lower portion that also extends along the length of the body portion. The upper portion includes a deflector portion and the lower portion includes a curved portion. The deflector portion of the upper portion and the curved portion of the lower portion define an exhaust opening in the body portion to allow the exhaust air from the electronic chassis to pass through the exhaust opening in a downward direction and to conceal an inside portion of the electronic chassis.

16 Claims, 3 Drawing Sheets

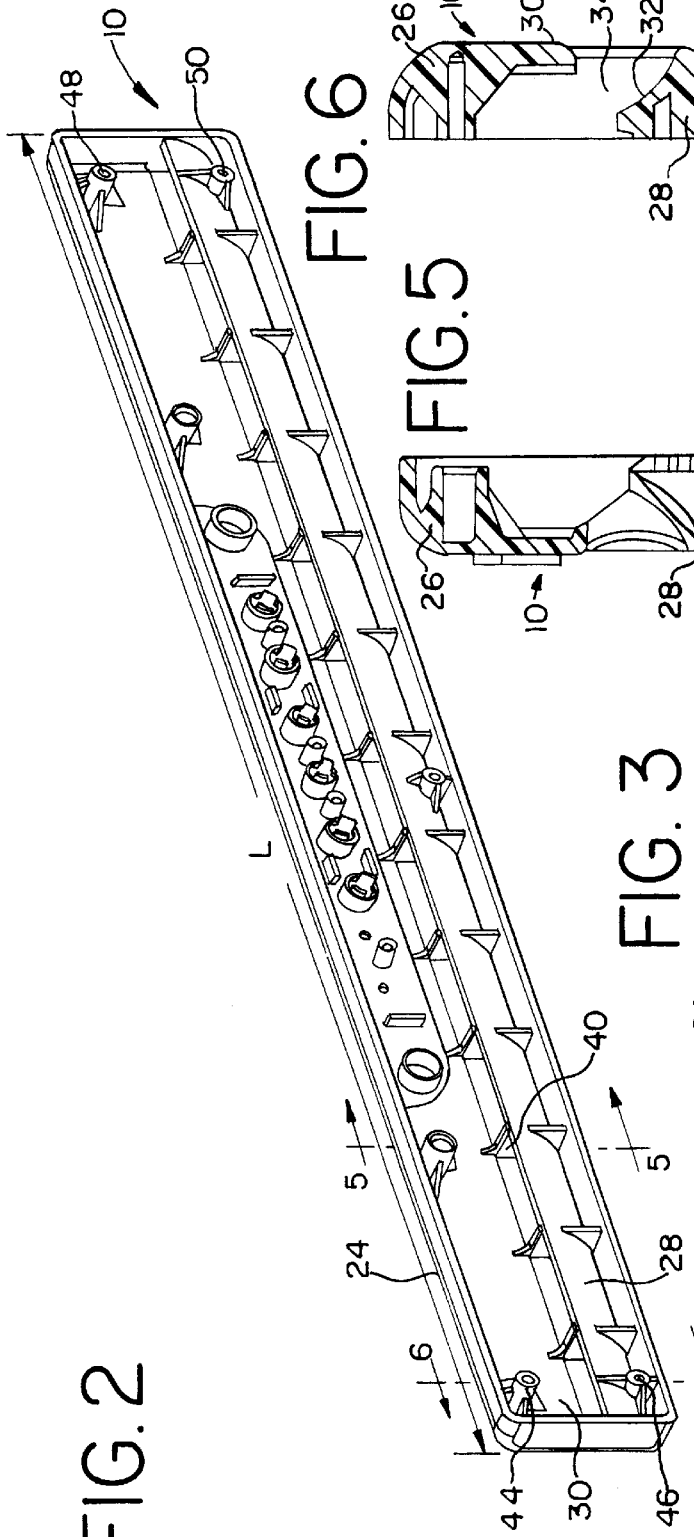

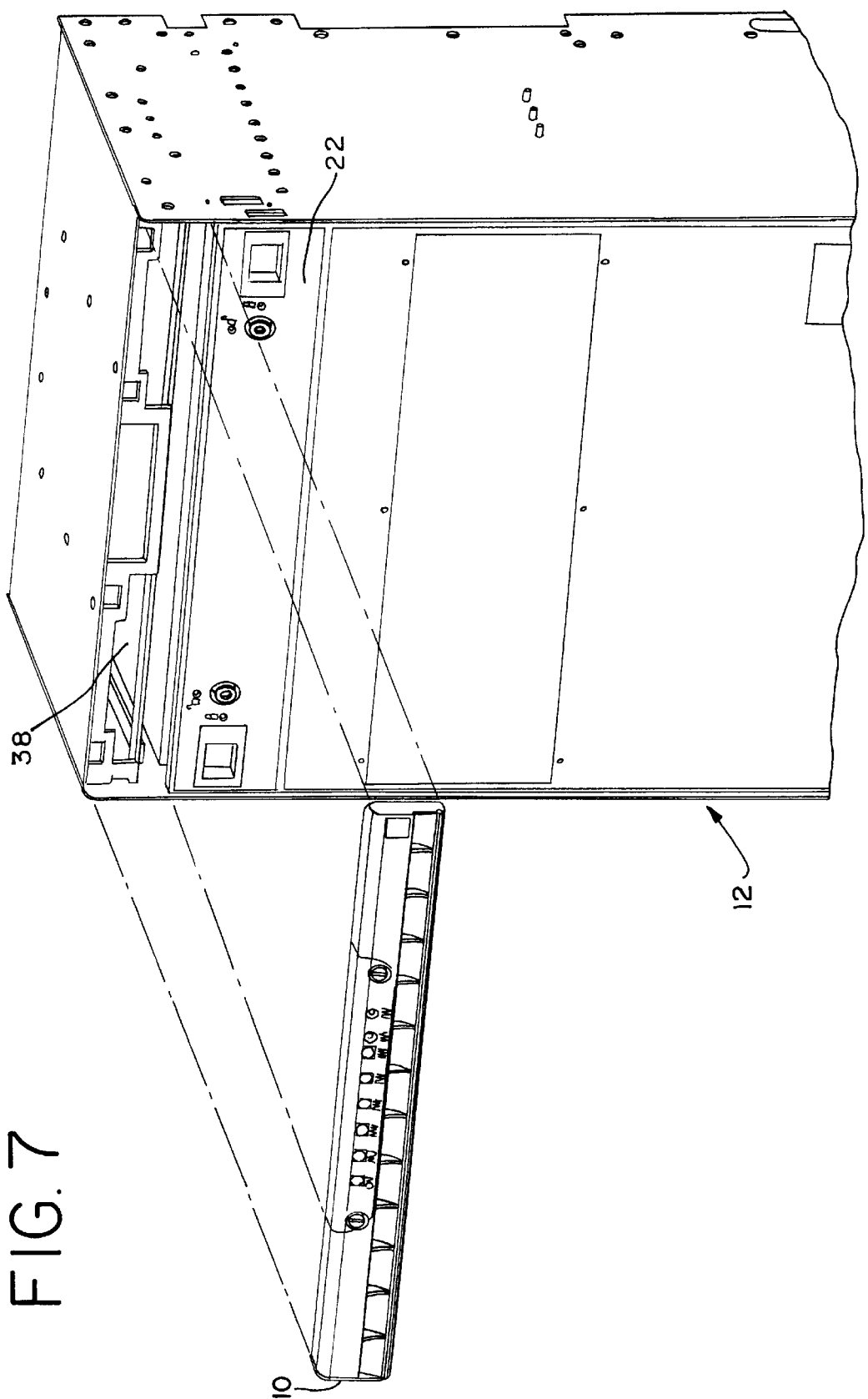

EXHAUST VENT FOR AN ELECTRONIC CHASSIS

FIELD OF THE INVENTION

This invention relates generally to the field of exhaust vents and, in particular, to an exhaust vent for an electronic chassis that houses various electronic components.

BACKGROUND OF THE INVENTION

Electronic chassis, which house electronic components for high-speed telecommunication and networking applications, are typically mounted on a rack that is in turn enclosed in an electronics cabinet. The chassis are typically positioned in the rack in a vertically stacked orientation, one on top of the other.

Each chassis is typically a box-like structure having top, bottom and side walls. The bottom wall of the chassis typically has openings to allow air to circulate up through the chassis. A plurality of vertically oriented application cards is typically inserted into the chassis. A fan tray assembly including a plurality of fans is typically located adjacent the top of the chassis, which, in operation, draws air upward from the bottom of the chassis and between the application cards to provide ventilation for various electronic components mounted on the application cards. A horizontally oriented air filter is typically inserted into a bottom portion of the chassis to prevent airborne pollutants, such as dirt particles, from entering the chassis and interfering with the electronic components housed within the chassis.

Attempts have made to provide a vent adjacent the top of the chassis to vent heated exhaust air out of the chassis. These vents are located along the front face of the chassis so that the exhaust air exits the chassis in a direction that is generally perpendicular to the front face of the chassis. Convention vents are typically screen-like structures that have a plurality of round or square openings. In the alternative, louvered openings may be provided. There are, however, many disadvantages to these conventional exhaust vents. For example, conventional exhaust vents typically restrict the amount of flow of exhaust air through the chassis an unacceptable amount, which may result in the overheating of the electronic components in the chassis. Moreover, conventional exhaust vents do not force the exhaust air downwardly as it exits the chassis. As a result, heated exhaust air that exits a first chassis can more easily be drawn into a second chassis positioned immediately above the first chassis thereby causing overheating of the electronic components in the second chassis. Finally, conventional exhaust vents typically do not provide an aesthetically pleasing solution for venting because they allow the interior of the chassis to be viewed from the outside, and therefore do not conceal the internal components of the chassis.

Accordingly, it would be desirable to have an exhaust vent for an electronic chassis that overcomes the disadvantages described above.

SUMMARY OF THE INVENTION

One aspect of the invention provides an exhaust vent for mounting to an electronic chassis including a body portion having a length. The body portion includes an upper portion extending along the length of the body portion and a lower portion extending along the length of the body portion. The upper portion includes a deflector portion and the lower portion includes a curved portion. The deflector portion of the upper portion and the curved portion of the lower portion defines an exhaust opening in the body portion to allow exhaust air to pass through the exhaust opening. The exhaust air may preferably pass through the exhaust opening in a downward direction. The exhaust air may preferably pass through the exhaust opening at an angle of about 30 to about 45 degrees from vertical. A plurality of stiffening ribs may preferably be spaced apart along the curved portion. The plurality of stiffening ribs may preferably define a plurality of exhaust ports along the length of the body portion. The body portion may preferably include a plurality of fastener openings and may be comprised of molded plastic.

Another aspect of the invention provides an exhaust vent for venting exhaust air from an electronic chassis. A body portion including a length is mounted to the electronic chassis. The body portion includes an upper portion extending along the length of the body portion and a lower portion extending along the length of the body portion. The upper portion includes a deflector portion and the lower portion includes a curved portion. The deflector portion of the upper portion and the curved portion of the lower portion defines an exhaust opening in the body portion to allow the exhaust air from the electronic chassis to pass through the exhaust opening in a downward direction and to conceal an inside portion of the electronic chassis. The body portion may preferably be mounted to a top portion of the electronic chassis.

Another aspect of the invention provides a method of venting exhaust air from an electronic chassis. A body portion including a length is provided. The body portion includes an upper portion extending along the length of the body portion and a lower portion extending along the length of the body portion. The upper portion includes a deflector portion and the lower portion includes a curved portion. The deflector portion of the upper portion and the curved portion of the lower portion defines an exhaust opening in the body portion. The body portion is mounted to the electronic chassis. Exhaust air from the electronic chassis is passed through the exhaust opening in a downward direction, and an inside portion of the electronic chassis is concealed. The exhaust air may preferably be passed through the exhaust opening at an angle of about 30 to about 45 degrees from vertical. Exhaust air may preferably be passed through a fan tray assembly positioned within the electronic chassis. The exhaust air may preferably contact a top wall of the electronic chassis. The exhaust air may then be deflected off the top wall of the electronic chassis to the exhaust opening. Room air from the room in which the electronic chassis is situated may preferably be passed into a bottom portion of the electronic chassis. The room air may preferably be passed through the electronic chassis in an upward direction.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 2 is a perspective view of the back side of the exhaust vent of FIG. 1;

FIG. 3 is a perspective view of the front side of the exhaust vent of FIG. 1;

FIG. 4 is a sectional view of the taken along line 4—4 of FIG. 1;

FIG. 5 is a sectional view taken along line 5—5 of FIG. 2;

FIG. 6 is a sectional view taken along line 6—6 of FIG. 2; and

FIG. 7 is a partial view of the electronic chassis of FIG. 1 showing the exhaust vent exploded from the electronic chassis.

DETAILED DESCRIPTION OF THE PRESENTLY PREFERRED EMBODIMENTS

Figure 1:
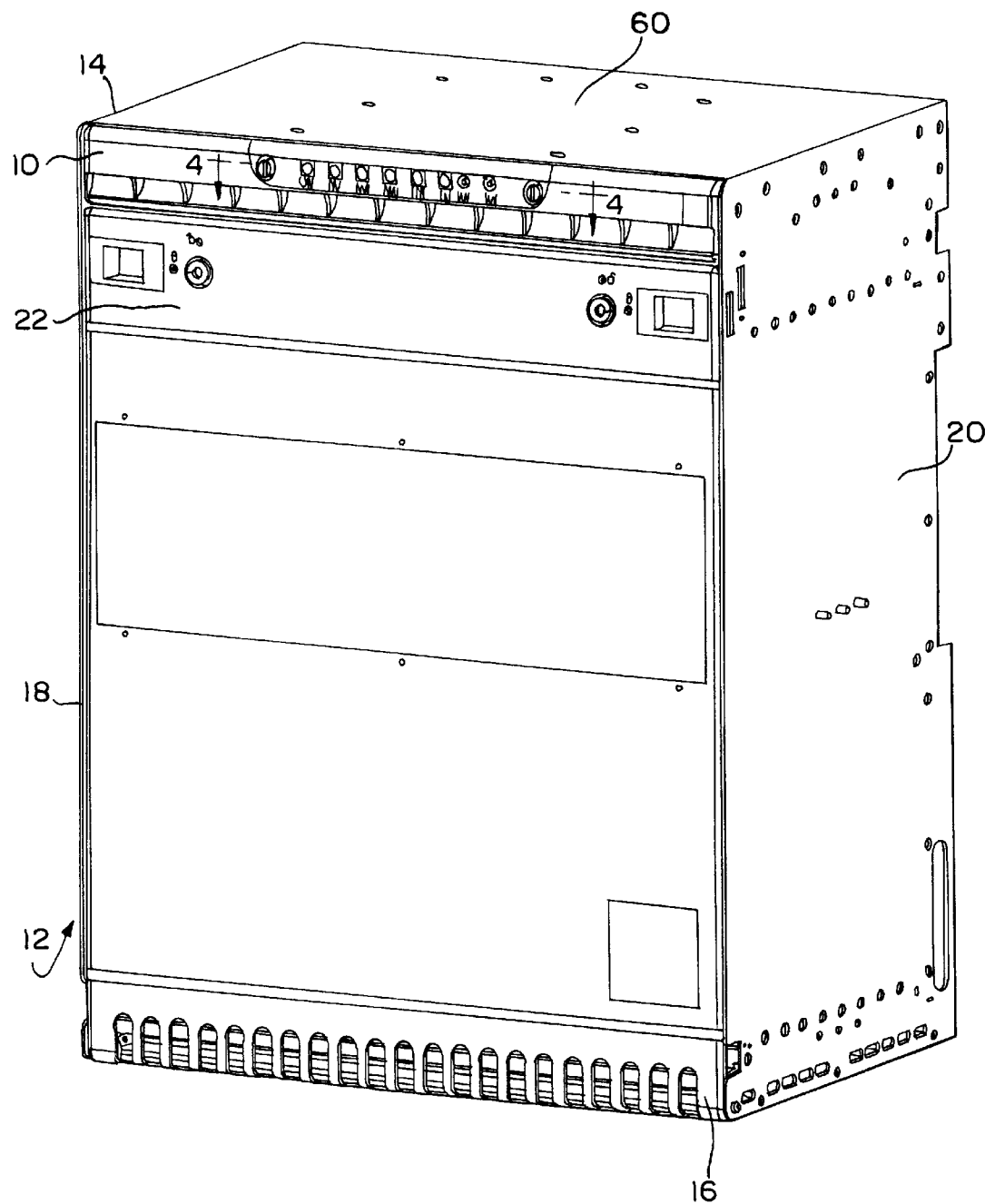
FIG. 1 is a perspective view of a preferred embodiment of an exhaust vent that is made in accordance with the invention showed mounted to an electronic chassis.

As shown in FIGS. 1–7, a preferred embodiment of an exhaust vent 10 is shown for venting exhaust air from an electronic chassis 12. Referring to FIGS. 1 and 7, the electronic chassis 12 may preferably include a top portion 14, a bottom portion 16, a first side wall portion 18, and a second side wall portion 20. In the embodiment shown, the exhaust vent 10 is configured in such a manner as to be received in the top portion 14 of the electronic chassis 12.

As shown in FIGS. 1 and 7, the top portion 14 and the bottom portion 16 of the electronic chassis 12 are substantially parallel to one another. Similarly, the first side wall portion 18 and the second side wall portion 20 are substantially parallel to one another. In the embodiment shown, the top portion 14, the bottom portion 16, and the first and second side wall portions 18, 20 are configured in such a manner as to define an electronic chassis 12 having a generally rectangular shape. However, various alternative configurations of the electronic chassis 12 are contemplated.

The electronic chassis 12 may be any suitable metal enclosure for housing various electronic components that carry out various functions such as, for example, telecommunications and networking functions. For example, the electronic chassis 12 may house conventional high-speed application cards (not shown). The electronic chassis 12 may preferably be comprised of any suitable rigid metal including, for example, steel.

The electronic chassis 12 may preferably include a fan tray assembly 22 that is positioned within the electronic chassis 12. In the embodiment shown, the fan tray assembly 22 is preferably located adjacent to the top portion 14 of the electronic chassis 12. The fan tray assembly 22 may preferably include a plurality of fans (not shown). Each of the fans may preferably be positioned within the fan tray assembly 22 in such a manner as to draw room air from the room in which the electronic chassis 12 is situated into the bottom portion 16 of the electronic chassis 12. The room air may be drawn in an upward direction through the inside of the chassis 12 to cool to the electronic components within the chassis 12. The heated exhaust air may then be exhausted out of the chassis 12 through the top portion 14 of the chassis 12 and, in particular, through the exhaust vent 10.

The exhaust vent 10 for mounting to the electronic chassis 12 is shown in greater detail in FIGS. 2–6. In the embodiment shown, the exhaust vent 10 includes a body portion 24 including a length (L). As shown in FIGS. 1 and 7, the body portion 24 may preferably be mounted to the top portion 14 of the electronic chassis 12. The body portion 24 may preferably be comprised of molded plastic, or any other suitable rigid material.

As shown in greater detail in FIGS. 2–6, the body portion 24 includes an upper portion 26 extending along the length (L) of the body portion 24 and a lower portion 28 extending along the length (L) of the body portion 24. The upper portion 26 includes a deflector portion 30 and the lower portion 28 include a curved portion 32. The deflector portion 30 of the upper portion 26 and the curved portion 32 of the lower portion 28 define an exhaust opening 34 in the body portion 24. The exhaust vent 10 allows exhaust air from the electronic chassis 12 to pass through the exhaust opening 34 in a downward direction. The exhaust air may preferably pass through the exhaust opening 34 at an angle of about 30 to about 45 degrees from vertical. In addition, the exhaust vent 10 conceals an inside portion 38 (FIG. 7) of the electronic chassis 12.

Referring to FIGS. 2–3, a plurality of stiffening ribs 40 may preferably be spaced apart along the curved portion 32. The stiffening ribs 40 may preferably be positioned substantially perpendicular to the curved portion 32, and may extend from the curved portion 32 to the upper portion 26 to increase the structural rigidity of the exhaust vent 10. The plurality of stiffening ribs 40 may preferably define a plurality of exhaust ports 42 along the length (L) of the body portion 24.

As shown in FIG. 2, the body portion 24 may preferably include a plurality of fastener openings 44, 46, 48, and 50. The fastener openings 44, 46, 48, and 50 may preferably be any suitable configuration to allow the body portion 24 to be attached to the electronic chassis 12.

In operation, each of the fans of the fan tray assembly 22 may preferably draw room air from the room in which the electronic chassis 12 is situated into the bottom portion 16 of the electronic chassis 12. Room air may then be passed through the inside of the electronic chassis 12 in an upward direction thereby cooling the electronic components within the electronic chassis 12. Heated exhaust air then passes through the fans in the fan tray assembly 22 positioned within the electronic chassis 12. The fans continue to direct the exhaust air in an upward direction toward the inside surface of the top wall 60 of the electronic chassis 12. The exhaust air may then preferably be deflected off the top wall 60 of the electronic chassis 12 in a direction toward the exhaust opening 34 in the body portion 24. Exhaust air is then passed from the inside of the electronic chassis 12 through the exhaust opening 34 in a downward direction. The advantage of this arrangement is that the exhaust air is directed away from a second electronic chassis that may be located immediately above. As a result, exhaust air from one electronic chassis is not drawn into the air intake area of a second electronic chassis thereby preventing overheating of the electronic components in the second electronic chassis. The exhaust air may preferably be directed through the exhaust opening at an angle of about 30 to about 45 degrees from vertical.

The exhaust vent 10 conceals the inside portion 38 of the electronic chassis 12 from view without restricting the amount of flow of exhaust air through the exhaust vent 10. This reduction in exhaust airflow impedance increases the performance of the fans in the fan tray 22, which in turn reduces the temperature inside of the electronic chassis 12. Reducing the operating temperature inside of the electronic chassis 12 increases the reliability of the electronic components within the electronic chassis 12.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An exhaust vent comprising:
a body portion for mounting to an electronic chassis, the body portion including a length, the body portion including an upper portion extending along the length of the body portion and a lower portion extending along the length of the body portion, the upper portion including a deflector portion and the lower portion including a curved portion, the curved portion including a curved front surface and a curved back surface, at least one stiffening rib contacting the curved portion and extending perpendicular to the curved portion, the at least one stiffening rib including a first curved portion and a second curved portion, the first curved portion extending along the curved front surface and the second curved portion extending along the curved back surface, the deflector portion of the upper portion and the curved portion of the lower portion defining an exhaust opening in the body portion to allow exhaust air to pass through the exhaust opening.

2. The apparatus of claim 1 wherein the exhaust air passes through the exhaust opening in a downward direction.

3. The apparatus of claim 1 wherein the at least one stiffening rib comprises a plurality of stiffening ribs spaced apart along the curved portion.

4. The apparatus of claim 3 wherein the plurality of stiffening ribs define a plurality of exhaust ports along the length of the body portion.

5. The apparatus of claim 2 wherein the exhaust air passes through the exhaust opening at an angle of about 30 to about 45 degrees from vertical.

6. The apparatus of claim 1 wherein the body portion includes a plurality of fastener openings.

7. The apparatus of claim 1 wherein the body portion is comprised of molded plastic.

8. An exhaust vent for venting exhaust air from an electronic chassis comprising:
an electronic chassis including a first side wall and a second side wall, a body portion including a length, the body portion mounted to the electronic chassis, the body portion extending from the first side wall across to the second side wall, the body portion including an upper portion extending along the length of the body portion and a lower portion extending along the length of the body portion, the upper portion including a deflector portion and the lower portion including a curved portion, the curved portion including a curved front surface and a curved back surface, at least one stiffening rib contacting the curved portion and extending perpendicular to the curved portion, the at least one stiffening rib including a first curved portion and a second curved portion, the first curved portion extending along the curved front surface and the second curved portion extending along the curved back surface, the deflector portion of the upper portion and the curved portion of the lower portion defining an exhaust opening in the body portion to allow the exhaust air from the electronic chassis to pass through the exhaust opening in a downward direction and to conceal an inside portion of the electronic chassis.

9. The apparatus of claim 8 wherein the body portion is mounted to a top portion of the electronic chassis.

10. A method of venting exhaust air from an electronic chassis comprising:
providing a body portion including a length, the body portion including an upper portion extending along the length of the body portion and a lower portion extending along the length of the body portion, the upper portion including a deflector portion and the lower portion including a curved portion, the curved portion including a curved front surface and a curved back surface, at least one stiffening rib contacting the curved portion and extending perpendicular to the curved portion, the at least one stiffening rib including a first curved portion and a second curved portion, the first curved portion extending alone the curved front surface and the second curved portion extending along the curved back surface, the deflector portion of the upper portion and the curved portion of the lower portion defining an exhaust opening in the body portion;

mounting the body portion to the electronic chassis;

passing the exhaust air from the electronic chassis through the exhaust opening in a downward direction; and concealing an inside portion of the electronic chassis.

11. The method of claim 10 further comprising:
passing the exhaust air through the exhaust opening at an angle of about 30 to about 45 degrees from vertical.

12. The method of claim 10 further comprising:
passing the exhaust air through a fan tray assembly positioned within the electronic chassis.

13. The method of claim 10 further comprising:
contacting the exhaust air with a top wall of the electronic chassis.

14. The method of claim 10 further comprising:
deflecting the exhaust air off the top wall of the electronic chassis to the exhaust opening.

15. The method of claim 10 further comprising:
passing room air into a bottom portion of the electronic chassis.

16. The method of claim 15 comprising:
passing the room air through the electronic chassis in an upward direction.

* * * * *